(12) United States Patent
Gou

(10) Patent No.: US 9,861,156 B2
(45) Date of Patent: Jan. 9, 2018

(54) CIRCUIT DEVICE FOR LUMINOUS SHOE

(71) Applicant: TERRY ELECTRONCS (S.Z) CO., LTD., Shenzhen (CN)

(72) Inventor: John Gou, Shenzhen (CN)

(73) Assignee: TERRY ELECTRONCS (S.Z) CO., LTD., Shenzhen (CN)

( * ) Notice: Subject to any disclaimer, the term of this patent is extended or adjusted under 35 U.S.C. 154(b) by 0 days.

(21) Appl. No.: 15/281,295

(22) Filed: Sep. 30, 2016

(65) Prior Publication Data

US 2017/0016602 A1 Jan. 19, 2017

Related U.S. Application Data

(63) Continuation-in-part of application No. 14/468,467, filed on Aug. 26, 2014, now abandoned.

(51) Int. Cl.
*F21V 23/00* (2015.01)
*F21V 31/00* (2006.01)
*A43B 3/00* (2006.01)
*H05K 1/18* (2006.01)

(52) U.S. Cl.
CPC .............. *A43B 3/001* (2013.01); *H05K 1/189* (2013.01); *H05K 2201/10106* (2013.01)

(58) Field of Classification Search
CPC .... F21V 23/005; F21V 23/04; F21V 23/0471; F21V 33/0008
See application file for complete search history.

(56) References Cited

U.S. PATENT DOCUMENTS

| 2006/0007670 A1* | 1/2006 | Chien | A43B 1/0036 |
| | | | 362/103 |
| 2014/0157632 A1* | 6/2014 | Kim | A43B 3/001 |
| | | | 36/137 |

* cited by examiner

*Primary Examiner* — Joseph L Williams

(57) ABSTRACT

A luminous shoe of the disclosure includes a sole and a light-emitting device located at the sole. The light-emitting device includes a control box, a controller located in the control box, and a light belt exposed out of the control box and electrically connected with the control box. The light belt includes a housing, a FFC received in the housing, N first circuit boards located on the FFC and electrically connected to the controller, N luminous elements located on the first circuit boards and electrically connected to the controller. The controller drives the N luminous elements lighting based on a first pre-defined lighting mode, a second pre-defined lighting mode, and a third pre-defined lighting mode randomly.

12 Claims, 4 Drawing Sheets

CIRCUIT DEVICE FOR LUMINOUS SHOE

CROSS REFERENCE TO RELATED APPLICATION

This application is a continuation in part of application of U.S. patent application Ser. No. 14/468,467, entitled "LUMINOUS SHOE" filed on Aug. 26, 2014. The above listed applications is hereby incorporated by reference herein as if set forth in its entirety.

BACKGROUND

1. Technical Field

The present disclosure generally relates to shoes, and especially to a luminous shoe.

2. Description of Related Art

Luminous shoes are popular with children and young people due to the fashion appearance and safety of the luminous shoes. When people wear the luminous shoes, the luminous shoes generally emit lights with various colors to highlight the personalization and the fashion of the shoes.

The luminous shoe generally includes a light-emitting device mounted on a sole of the shoe. The light-emitting device includes a light belt and a control box driving the light belt to emit light. In the prior arts, the light belt generally includes a FPC (flex printed circuit) and a plurality of luminous elements located on the FPC. Because it is easy for the FPC to be deformed, the luminous elements on the FPC are prone to be out of order. As a result, flashing directions of the luminous elements are incongruous, which influences the lighting effect and the overall visual impression of the luminous shoe.

Therefore, a need exists in the industry to overcome the described problems.

SUMMARY

One aspect of the present invention is to provide a luminous shoe including a sole and a light-emitting device located at the sole. The light-emitting device includes a control box, a controller located in the control box, and a light belt exposed out of the control box and electrically connected with the control box. The light belt includes a housing, a FFC received in the housing, N first circuit boards located on the FFC and electrically connected to the controller, N luminous elements located on the first circuit boards and electrically connected to the controller. The controller drives the N luminous elements lighting based on a first pre-defined lighting mode, a second pre-defined lighting mode, and a third pre-defined lighting mode randomly. The first pre-defined lighting mode is the luminous elements lighting simultaneously, the second pre-defined lighting mode is the N-th luminous element and the (N+1)-th luminous element lighting in an interleaved manner, and the third pre-defined lighting mode is the luminous elements lighting sequentially.

The light-emitting device further includes a rechargeable battery located at the controller and electrically connected with the controller, and a battery charging interface exposed out of the control box and electrically connected with the controller. The rechargeable battery supplies power for the light-emitting device, and is charged with electricity by the way of a connection between the battery charging interface and an external power source.

The light-emitting device further includes a manual button switch exposed out of the control box and electrically connected with the controller, for triggering the controller in response to a motion of the luminous shoe. Under a standby mode of the light belt, if a pressing span of the manual button switch is greater than a first predetermined time, the controller drives the light belt to open, and the light belt works according to the first pre-defined lighting mode, the second pre-defined lighting mode, and the third pre-defined lighting mode randomly. Under a lighting state of the light belt, per the manual button switch is pressed once, and the pressing span of the manual button switch is less than a second predetermined time, the controller controls the light belt to change among the first pre-defined lighting mode, the second pre-defined lighting mode, and the third pre-defined lighting mode. Under the lighting state of the light belt, if the pressing span of the manual button switch is greater than the first predetermined time, the controller controls the light belt to close. The first predetermined time is greater than the second predetermined time.

under a standby mode of the light belt, if the manual button switch is pressed, the controller drives the light belt to open, and the light belt works according to the first pre-defined lighting mode, the second pre-defined lighting mode, and the third pre-defined lighting mode randomly; under a lighting state of the light belt, per the manual button switch is pressed once, the controller controls the light belt to change among the first pre-defined lighting mode, the second pre-defined lighting mode, and the third pre-defined lighting mode; under the lighting state of the light belt, if the manual button switch is pressed, the controller controls the light belt to close after the first pre-defined lighting mode, the second pre-defined lighting mode, and the third pre-defined lighting mode are turned to complete.

Each of the N luminous elements comprises three LEDs, in the third pre-defined lighting mode, one of the three LEDs of each of the N luminous elements lights up sequentially.

Each of the N luminous elements comprises three LEDs, in the third pre-defined lighting mode, two of the three LEDs of each of the N luminous elements light up sequentially.

Another aspect of the present invention is to provide a circuit device, and more particularly, to provide to a circuit device for controlling N luminous elements disposed on a luminous shoe in a pre-defined lighting mode. The controller of the invention is capable of controlling the N luminous elements to generate an attractive pattern.

The circuit device includes a control box embedded in the luminous shoe, a manual button switch, and a controller. The manual button switch is mounted in the control box, for triggering a controller in response to a motion of the luminous shoe. The controller is mounted in the control box and electrically connected to the manual button switch and the N luminous elements, for driving the N luminous elements lighting based on a first pre-defined lighting mode, a second pre-defined lighting mode, and a third pre-defined lighting mode randomly. The first pre-defined lighting mode is the luminous elements lighting simultaneously, the second pre-defined lighting mode is N-th luminous element and the (N+1)-th luminous element lighting in an interleaved manner, and the third pre-defined lighting mode is the luminous elements lighting sequentially.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover.

DETAILED DESCRIPTION

Figure 1:
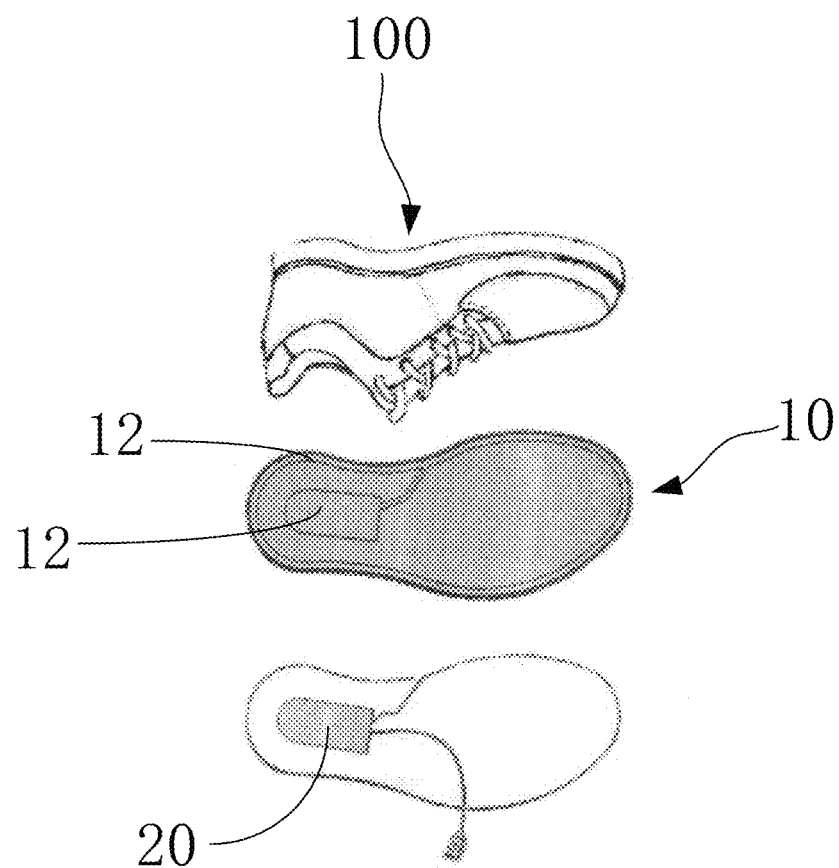
FIG. 1 is an exploded view of a luminous shoe of the disclosure.

The disclosure is illustrated by way of example and not by way of limitation in the figures of the accompanying drawings, in which like reference numerals indicate similar elements. It should be noted that references to "an" or "one" embodiment in this disclosure are not necessarily to the same embodiment, and such references can mean "at least one" embodiment.

Figure 2:
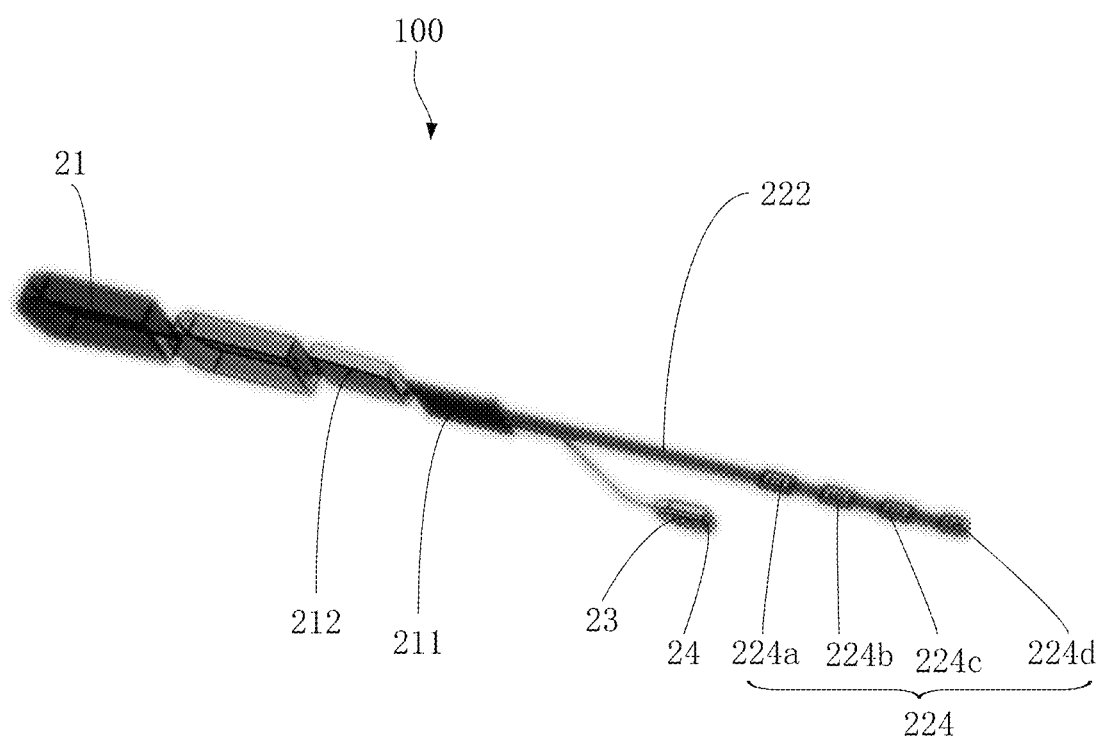
FIG. 2 is a schematic perspective view of a light-emitting device of FIG. 1 according to an exemplary embodiment of the disclosure.

With reference to FIG. 1 and FIG. 2, a luminous shoe 100 includes a sole 10 and a light-emitting device 20 located at the sole 10. The light-emitting device 20 includes a control box 21 and a light belt 22 exposed out of the control box 21 and electrically connected with the control box 21.

In the embodiment, the sole 10 defines a receiving slot 11 at a bottom of the sole 10, and defines a mounting groove 12 on sides of the sole 10. The mounting groove 12 extends around a circumferential direction of the sole 10. In assembly, the control box 21 is received in the receiving slot 11, and is fixed with the sole 10 by a fixing cover (not shown). The light belt 22 is received in the mounting groove 12, and is configured around the sides of the sole 10.

Alternatively, the light belt 22 may be configured on other positions of the luminous shoe 100 according to appearance requirements of the luminous shoe 100, such as a shoe upper of the luminous shoe 100.

With reference to FIG. 2, the light belt 22 includes a waterproof housing 221, a FFC (Flexible Flat Cable) 222 received in the housing 221, and N first circuit boards 223 located on the FFC 222 and electrically connected to the FFC 222, wherein N is an integer larger than 1. N luminous elements 224, for example 224a, 224b, 224c, 224d, are located on the N first circuit boards 223. The control box 21 drives the luminous elements 224 to light, so that the luminous shoe 100 emits lights with various colors.

It follows that, the FFC 222 of the disclosure is fixed in the housing 221 of the light belt 22. As a result, the first circuit boards 223 together with the luminous elements 224 located on the FFC 222 are arranged in order, due to fixation of the FFC 222 in the housing 221, which ensures uniformity of the flashing direction of the luminous elements 224. Therefore, when the luminous shoe 100 is lighting, the overall visual impression and the beauty of the luminous shoe 100 are improved.

In one embodiment, the housing 221 is made of plastic, such as elastomers, PVC (Polyvinyl chloride polymer), and is transparent. According to the invention, the housing 221 is embedded in the sole 10 or the shoe upper of the luminous shoe 100. The waterproof housing 221 can keep the first circuit board 223 from being humidify, being oxidized, or being contaminated, further elongating the life of the first circuit board 223.

In the embodiment, each of the luminous elements 224 comprises a LED or a plurality of LEDs, for example, three LEDs. The LED is fixed on the first circuit board 223 by a SMT (surface mounting technology) process, and is electrically connected with the first circuit board 223. In practice, the LED can be a red LED, a blue LED, a green LED, or other suitable LED.

In the embodiment, a controller 211 is located in the control box 21. The light-emitting device 20 further includes a rechargeable battery 212 and a charging interface 24. The rechargeable battery 212 is located on the controller 211, and is electrically connected with the controller 211. The rechargeable battery 212 is configured to supply power for the light-emitting device 20. The charging interface 24 exposes out of the control box 21 and electrically connected with the controller 211. The rechargeable battery 212 is charged with electricity by the way of the connection between the battery charging interface 24 and an external power source.

It follows that, when the battery power of the rechargeable battery 212 is low, the rechargeable battery 212 is charged with electricity by the connection between the battery charging interface 24 and the external power source. As a result, the lighting function of the luminous shoe 100 is available continually. When the battery power of the rechargeable battery 212 is low, it is not necessary for consumers to worry about invalidity of the lighting function of the luminous shoe 100. Therefore, the rechargeable battery 212 of the luminous shoe 100 of the disclosure ensures stability and persistence the lighting function of the luminous shoe 100, which improves purchase intention of the consumers.

Figure 3:
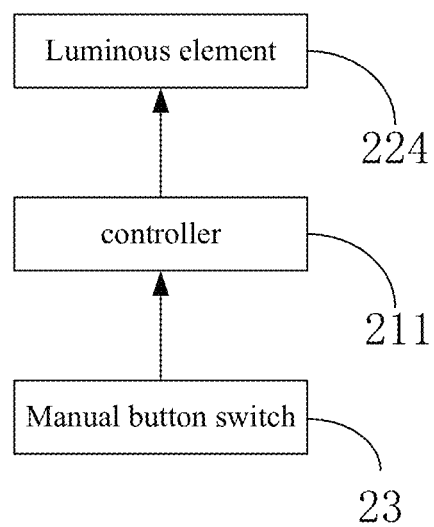
FIG. 3 is a function block of a circuit device of an embodiment of the invention.

With reference to FIG. 2 and FIG. 3, in a first exemplary embodiment, the light-emitting device 20 further includes a manual button switch 23 electrically connected with the controller 211. That is to say, the controller 211 is electrically connected to the manual button switch 23 and each of the N luminous elements 224 respectively, for driving the N luminous elements 224 lighting based on a first pre-defined lighting mode, a second pre-defined lighting mode and a third pre-defined lighting mode, randomly. In one embodiment, the first pre-defined lighting mode, the second pre-defined lighting mode and the third pre-defined lighting mode are defined as a pre-defined lighting mode. Thus, the controller 211 controls the N luminous elements 224 to generate an attractive pattern.

In addition, the first pre-defined lighting mode is that the luminous elements 224a, 224b, 224c, 224d light up simultaneously. The second pre-defined lighting mode is that the luminous elements 224a, 224c, light up simultaneously, and then the luminous elements 224b, 224d, light up simultaneously, that is to say, the N-th luminous element and the (N+1)-th luminous element light in an interleaved manner. The third pre-defined lighting mode is that the luminous elements 224a, 224b, 224c, 224d light up sequentially. When each of the N luminous elements 224 comprises three LEDs, in the third pre-defined lighting mode one of the three LEDs of each of the luminous elements 224 lights up sequentially, or two of the three LEDs of each of the luminous elements 224 light up sequentially; in the second pre-defined lighting mode, in each of the N luminous elements 224, the N-th luminous element and the (N+1)-th luminous element light in an interleaved manner.

In the first exemplary embodiment, the manual button switch 23 exposes out of the control box 21 and is positioned on the shoe upper of the luminous shoe 100 (referring to FIG. 2).

Figure 4:
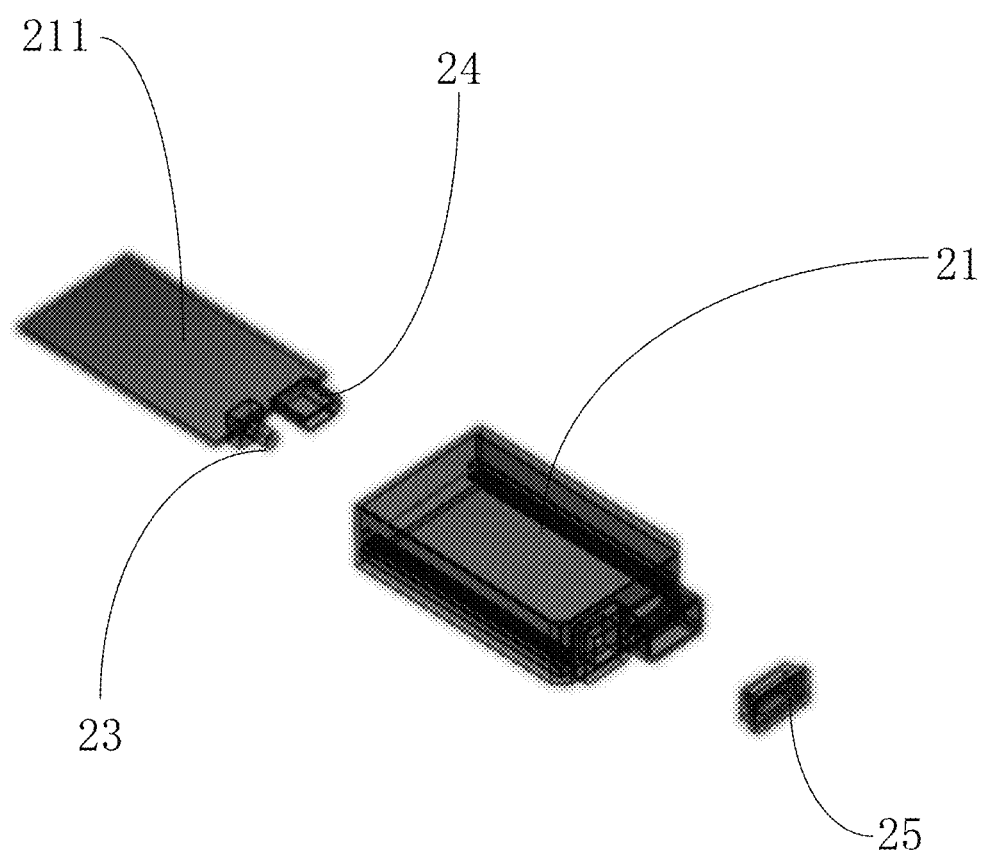
FIG. 4 is a schematic perspective view of a control box of a second embodiment of the disclosure.

In another embodiment, the manual button switch 23 exposes out of the control box 21 and is positioned on the sole 10 of the luminous shoe 100 (referring to FIG. 4). In the another embodiment, the light-emitting device 20 further comprises a rubber plug 25 to prevent the water into the control box 211.

When the controller 211 is connected to the rechargeable battery 212, the light belt 22 is in a standby mode. Under the standby mode of the light belt 22, if a pressing span of the manual button switch 23 is greater than a first predetermined time T1, the controller 211 drives the light belt 22 to open, and the light belt 22 works according to the first pre-defined lighting mode, the second pre-defined lighting mode, and the third pre-defined lighting mode randomly. In other words, Under the standby mode of the N luminous elements 224, if a pressing span of the manual button switch 23 is greater than a first predetermined time T1, the controller 211 drives the N luminous elements 224 lighting based on the first pre-defined lighting mode, the second pre-defined lighting mode, and the third pre-defined lighting mode randomly.

Under the lighting state of the light belt 22, per the manual button switch 23 is pressed once, and the pressing span of the manual button switch 23 is less than a second predetermined time T2, the controller 211 controls the light belt 22 to change the pre-defined lighting mode.

Under the lighting state of the light belt 22, and if the pressing span of the manual button switch 23 is greater than the first predetermined time T1, the controller 211 controls the light belt 22 to close. In the embodiment, the first predetermined time T1 is greater than the second predetermined time T2.

For example, the first predetermined time T1 is supposed to be 1 second, and the second predetermined time T2 is supposed to be 0.5 second, that is T1=1 s, T2=0.5 s. When the controller 211 is connected to the rechargeable battery 212, the light belt 22 is in the standby mode. Under the standby mode of the light belt 22, if the pressing span of the manual button switch 23 is greater than 1 second, such as 2 seconds, the controller 211 drives the light belt 22 to open, and the light belt 22 works according to the pre-defined lighting mode.

Under the lighting state of the light belt 22, per the manual button switch 23 is pressed once, and the pressing span of the manual button switch 23 is less than 0.5 second, such as 0.2 second, the conduction of the manual button switch 23 is instantaneous, and the controller 211 controls the light belt 22 to change the pre-defined lighting mode.

Under the lighting state of the light belt 22, if the pressing span of the manual button switch 23 is greater than 1 second, such as 1.5 second, the controller 211 controls the light belt 22 to close. That is, under the lighting state of the light belt 22, as long as the pressing span of the manual button switch 23 is greater than 1 second, the light belt 22 is closed at any time.

In the embodiment, the pre-defined lighting modes of the light belt 22 includes changes of the light color of the luminous elements 224, changes of lighting order of the luminous elements 224, and flashing order changes of the luminous elements 224, and so on. Of course, the pre-defined lighting modes of the light belt 22 may be set up according to requirements and fancy of the consumers.

Alternatively, the first predetermined time T1 and the second predetermined time T2 may be set up according to the light requirements of the luminous shoe 100.

It follows that, it only takes the manual button switch 23, the light belt 22 can be opened, closed, and carries out change of the pre-defined lighting mode. As a result, the quantity of the electrical components of the luminous shoe 100 is reduced, and operation for the light belt 22 is simple, which results of low cost and friendliness to consumers.

In another embodiment, under a standby mode of the light belt 22, if the manual button switch 23 is pressed, the controller 211 drives the light belt 22 to open, and the light belt 22 works according to the first pre-defined lighting mode, the second pre-defined lighting mode, and the third pre-defined lighting mode randomly; under a lighting state of the light belt 22, per the manual button switch 23 is pressed once, the controller 211 controls the light belt 22 to change among the first pre-defined lighting mode, the second pre-defined lighting mode, and the third pre-defined lighting mode; under the lighting state of the light belt 22, if the manual button switch 23 is pressed, the controller 211 controls the light belt to close after the first pre-defined lighting mode, the second pre-defined lighting mode, and the third pre-defined lighting mode are turned to complete.

In one embodiment, the control box 21, the rechargeable battery 212, the controller 211, and the manual button switch 23 are defined to a circuit device for controlling the N luminous elements 224 to light based on the first pre-defined lighting mode, the second pre-defined lighting mode and the third pre-defined lighting mode, randomly.

Please referring to FIG. 3 showing a function block of the circuit device of an embodiment of the invention. In the embodiment, when the N luminous elements 224 light up in accordance with the first pre-defined lighting mode, the second pre-defined lighting mode and the third pre-defined lighting mode described above.

Although the features and elements of the present disclosure are described as embodiments in particular combinations, each feature or element can be used alone or in other various combinations within the principles of the present disclosure to the full extent indicated by the broad general meaning of the terms in which the appended claims are expressed.

What is claimed is:

1. A luminous shoe comprising:
   a sole; and
   a light-emitting device located at the sole, wherein the light-emitting device comprises:
   a control box;
   a manual button switch;
   a controller located in the control box and configured to be electrically connected with the manual button switch in response to opening and closing of a light belt; and
   the light belt exposed out of the control box and electrically connected with the controller, wherein the light belt comprises:
   a waterproof housing;
   a flexible flat cable (FFC) received in the housing;
   N first circuit boards located on the FFC and electrically connected to the controller, wherein N is an integer larger than 1; and
   N luminous elements located on the N first circuit boards and electrically connected with the controller, each of the N luminous elements comprising at least one LED (light-emitting diode);
   wherein the controller drives the light belt to open and close in response to manual pressing of the manual button switch, wherein the opening and closing of the light belt actuates the N luminous elements to light based on a random pre-defined lighting mode including a first pre-defined lighting mode, a second pre-defined lighting mode, and a third pre-defined lighting mode, and wherein the first pre-defined lighting mode lights the luminous elements simultaneously, the second pre-defined lighting mode lights the N-th luminous element and the (N+1)-th luminous element in an interleaved manner, and the third pre-defined lighting mode lights the luminous elements sequentially.

2. The luminous shoe of claim 1, wherein the light-emitting device further comprises a rechargeable battery located in the control box and electrically connected with the controller, and a battery charging interface exposed out of the control box and electrically connected with the controller, and wherein the rechargeable battery supplies power for the light-emitting device, and is charged with electricity by the way of a connection between the battery charging interface and an external power source.

3. The luminous shoe of claim 1, wherein the random pre-defined lighting mode further includes a standby mode, and in response to a pressing span of the manual button switch being greater than a first predetermined time, the controller drives the light belt to open based on the first pre-defined lighting mode, the second pre-defined lighting mode, and the third pre-defined lighting mode randomly;
wherein the random pre-defined lighting mode further includes a lighting state, and in response to pressing the manual button switch, and the pressing span of the manual button switch is less than a second predetermined time, the controller controls the light belt to change among the first pre-defined lighting mode, the second pre-defined lighting mode, and the third pre-defined lighting mode;
wherein under the lighting state of the light belt, in response to the pressing span of the manual button switch being greater than the first predetermined time, the controller controls the light belt to close; and
wherein the first predetermined time is greater than the second predetermined time.

4. The luminous shoe of claim 2, wherein the random pre-defined lighting mode further includes a standby mode, and in response to pressing the manual button switch, the controller drives the light belt to open based on the first pre-defined lighting mode, the second pre-defined lighting mode, and the third pre-defined lighting mode randomly;
wherein the random pre-defined lighting mode further includes a lighting state, and in response to pressing the manual button switch, the controller controls the light belt to change among the first pre-defined lighting mode, the second pre-defined lighting mode, and the third pre-defined lighting mode;
wherein under the lighting state of the light belt, in response to pressing the manual button switch, the controller controls the light belt to close after the first pre-defined lighting mode, the second pre-defined lighting mode, and the third pre-defined lighting mode are turned to complete.

5. The luminous shoe of claim 1, wherein each of the N luminous elements comprises three LEDs, in the third pre-defined lighting mode, in response to pressing the manual button switch, the controller controls one of the three LEDs of each of the N luminous elements to light sequentially.

6. The luminous shoe of claim 1, wherein each of the N luminous elements comprises three LEDs, in the third pre-defined lighting mode, in response to pressing the manual button switch, the controller controls two of the three LEDs of each of the N luminous elements to light sequentially.

7. A circuit device for controlling N luminous elements disposed on a luminous shoe, N being an integer larger than 1, and each of the N luminous elements comprising at least one LED, the circuit device comprising:
a control box embedded in the luminous shoe;
a manual button switch for triggering a controller in response to a motion of the luminous shoe; and
the controller mounted in the control box and electrically connected to the manual button switch and the N luminous elements, the controller configured for driving the N luminous elements to light based on a random pre-defined lighting mode including a first pre-defined lighting mode, a second pre-defined lighting mode, and a third pre-defined lighting mode;
wherein the first pre-defined lighting mode lights the luminous elements simultaneously, the second pre-defined lighting mode lights N-th luminous element and the (N+1)-th luminous element in an interleaved manner, and the third pre-defined lighting mode lights the luminous elements sequentially.

8. The circuit device of claim 7, wherein the circuit device further comprises a rechargeable battery located in the control box and electrically connected with the controller, and a battery charging interface exposed out of the control box and electrically connected with the controller, and wherein the rechargeable battery supplies power for the N luminous elements, and is charged with electricity by the way of a connection between the battery charging interface and an external power source.

9. The circuit device of claim 7, wherein the random pre-defined lighting mode further includes a standby mode, and in response to a pressing span of the manual button switch being greater than a first predetermined time, the controller drives the N luminous elements to open based on the first pre-defined lighting mode, the second pre-defined lighting mode, and the third pre-defined lighting mode randomly;
wherein the random pre-defined lighting mode further includes a lighting state, and in response to pressing the manual button switch, and the pressing span of the manual button switch is less than a second predetermined time, the controller controls the N luminous elements to change among the first pre-defined lighting mode, the second pre-defined lighting mode, and the third pre-defined lighting mode;
wherein under the lighting state, in response to the pressing span of the manual button switch being greater than the first predetermined time, the controller controls the N luminous elements to close; and
wherein the first predetermined time is greater than the second predetermined time.

10. The circuit device of claim 7, wherein the random pre-defined lighting mode further includes a standby mode, and in response to pressing the manual button switch, the controller drives the N luminous elements to open based on the first pre-defined lighting mode, the second pre-defined lighting mode, and the third pre-defined lighting mode randomly;
wherein the random pre-defined lighting mode further includes a lighting state, and in response to pressing the manual button switch, the controller controls the N luminous elements to change among the first pre-defined lighting mode, the second pre-defined lighting mode, and the third pre-defined lighting mode;
wherein under the lighting state of the N luminous elements, in response to pressing the manual button switch, the controller controls the N luminous elements to close after the first pre-defined lighting mode, the second pre-defined lighting mode, and the third pre-defined lighting mode are turned to complete.

11. The circuit device of claim 7, wherein each of the N luminous elements comprises three LEDs, in the third pre-defined lighting mode, in response to pressing the manual button switch, the controller controls one of the three LEDs of each of the N luminous elements to light sequentially.

12. The circuit device of claim 7, wherein each of the N luminous elements comprises three LEDs, in the third predefined lighting mode, in response to pressing the manual button switch, the controller controls two of the three LEDs of each of the N luminous elements to light sequentially.

* * * * *